United States Patent [19]

Winnek

[11] Patent Number: 5,337,102
[45] Date of Patent: Aug. 9, 1994

[54] INSTANT PRINTER FOR VOLUMETRIC IMAGING OF DATA FROM MAGNETIC RESONANCE IMAGING APPARATUS

[76] Inventor: Douglas A. Winnek, 28091 Robinson/Canyon Rd., Carmel, Calif. 93923

[21] Appl. No.: 736,854

[22] Filed: Jul. 29, 1991

[51] Int. Cl.⁵ ............................................. G03B 35/08
[52] U.S. Cl. ..................................... 354/115; 355/22
[58] Field of Search ............... 354/112, 114, 115, 125, 354/75, 76, 77, 78, 79; 358/244, 244.1, 244.2, 331, 332, 333, 345; 355/20, 22

[56] References Cited

U.S. PATENT DOCUMENTS

| | | | |
|---|---|---|---|
| 3,962,579 | 6/1976 | Winnek | 378/41 |
| 3,984,684 | 10/1976 | Winnek | 378/41 |
| 4,404,471 | 9/1983 | Winnek et al. | 250/482.1 |
| 4,487,490 | 12/1984 | McKee | 354/115 |
| 4,488,795 | 12/1984 | Winnek | 354/115 |
| 4,491,956 | 1/1985 | Winnek | 378/41 |
| 4,557,590 | 12/1985 | Winnek | 355/22 |
| 4,600,297 | 7/1986 | Winnek | 355/22 |
| 4,823,156 | 4/1989 | Shrader et al. | 354/115 |
| 4,922,285 | 5/1990 | Torisawa et al. | 355/20 |
| 4,945,407 | 7/1990 | Winnek | 358/88 |

Primary Examiner—Michael L. Gellner
Assistant Examiner—Howard B. Blankenship
Attorney, Agent, or Firm—Townsend and Townsend Khourie and Crew

[57] ABSTRACT

An optical system using a lens assembly with the screen of a computer CRT or LCD unit, said computer being coupled to an MRI apparatus for receiving data therefrom. Data from the MRI to be presented to the CRT screen is provided as a two-dimensional image rotatable about a selected axis. Light rays from the image pass through the slit of a curtain shutter so that a continuum of views of the image will be projected onto a lenticular film. In another embodiment a Ronchi grating is used. A film having an emulsion engages the back side of the Ronchi grating forwardly of a stationary lenticular screen. A motor drives the Ronchi grating transversely of the light rays. Thus, the rotating image will be represented by light rays which pass to the Ronchi grating. The light rays pass through the grating and expose the emulsion of the film. The film can then be processed and the continuum of images exposed on the film can be viewed through the lenticular screen as three-dimensional images of the two-dimensional image shown on the CRT screen and representing the MRI data. In the alternative, the Ronchi grating can remain stationary while the film moves relative to the grating.

20 Claims, 3 Drawing Sheets

INSTANT PRINTER FOR VOLUMETRIC IMAGING OF DATA FROM MAGNETIC RESONANCE IMAGING APPARATUS

This invention relates to improvement in the display of images which occur in two dimensions but which can be displayed in three dimensions. More particularly, the invention relates to the three-dimensional display of data from a magnetic resonance imaging apparatus using lenticular screen technology.

BACKGROUND OF THE INVENTION

A magnetic resonance imaging (MRI) apparatus is used to analyze various organs of the human body by obtaining a two-dimensional scan of the particular organs to obtain data which indicates the health of a patient. The data are generally presented for analyses on two-dimensional photographic films which can be enlarged as desired to bring out the details of the particular body organs under study.

Computer techniques have been developed up to the present time in which such data from an MRI apparatus can be presented on a CRT or LCD screen of a computer in such a way that, when wearing binocular eye glasses, a clinician is able to observe the images of the presented data from the MRI apparatus in three dimensions. Typically, the organ under study is imaged by a computer having a controller, a program and a keyboard which cooperate to cause the image to appear as a two-dimensional image on the CRT screen. The image is caused to rotate about a generally vertical axis which is arbitrarily selected or to translate relative to a predetermined reference so that, when the two-dimensional, rotational image is viewed by a clinician with binocular eye glasses, the image appears to the clinician as a three-dimensional image and appears further to be rotating around the selected axis or translated relative to the reference. Thus, detail of the organ under study can quickly be observed and a diagnosis of the condition of the organ can be made on the basis of the three-dimensional image viewed on the CRT or LCD screen of the computer. While the binocular eye glass viewing of the image on the computer CRT screen is satisfactory, improvements are needed to simplify the presentation of MRI data. The present invention provides such an improvement.

SUMMARY OF THE INVENTION

The present invention is directed to an optical system using a lens assembly between the viewing screen of a computer and a lenticular film, the computer being coupled to an MRI apparatus for receiving data therefrom. Moreover, the computer is operated under the influence of a controller coupled to a program or algorithm and a keyboard which will cause the data from the MRI to be presented to the CRT screen as a shiftable two-dimensional image. The image presented to the viewing screen is the detail represented by the data collected by the MRI unit.

The image on the CRT screen passes in the form of light rays through a lens assembly including an achromatic lens in which a curtain shutter with a vertical slit is movable past a horizontal slot in a fixed shutter member such that the image of the detail on the viewing screen is in the form of light rays. Thus, a continuum of views of the image will be projected downstream of the lens assembly after passing through the shutter.

The achromatic lens is a wide diameter lens, such as 5 to 6 inches in diameter. The light rays from the lens subtends an arc of 10° to 3020 . The focal length of the lens is typically 24 inches.

A lenticular film is mounted at a location spaced a distance equal to twice the focal length of the achromatic lens and in a position to intercept the light rays representing the continuum mentioned above. The lenticulas of the lenticular film focus the light rays on the emulsion side of the film which is away from the rear face of the lenticular screen attached to the film itself. The film is then processed in the normal manner and the film will be provided with a matrix in which the continuum of images is viewable as a three-dimensional image by viewing the film through the lenticular screen.

In another embodiment of the invention, a copy lens is placed between the image display on the computer viewing screen and a grating, such as a Ronchi grating which is a nine-to-one ratio grating, is used. A sensitive film having an emulsion engageable with the back side of the Ronchi grating is forwardly of a stationary lenticular screen having the film thereon. A motor drives the Ronchi grating transversely of the film and the light rays from the copy lens strikes the grating when an electronic shutter adjacent to the lens is triggered. Thus, the rotating image about an arbitrary axis shown on the CRT or LCD viewing screen will be represented by light rays which pass through the copy lens and the shutter and onto the front face of the grating. The light rays pass through the grating and expose the emulsion of the film with a series of views representing the rotating image or translated image. The film can then be processed and the continuum of images exposed on the film can be viewed through the lenticular screen as three-dimensional images of the two-dimensional image initially shown on the viewing screen and representing the MRI data. In the alternative, the grating can remain stationary while the film on the lenticular screen moves relative to the grating.

Other features and advantages of the present invention will become apparent as the following specification progresses, reference being had to the accompanying drawings for an illustration of several embodiments of the invention.

DETAILED DESCRIPTION OF THE DRAWINGS

Figure 1:
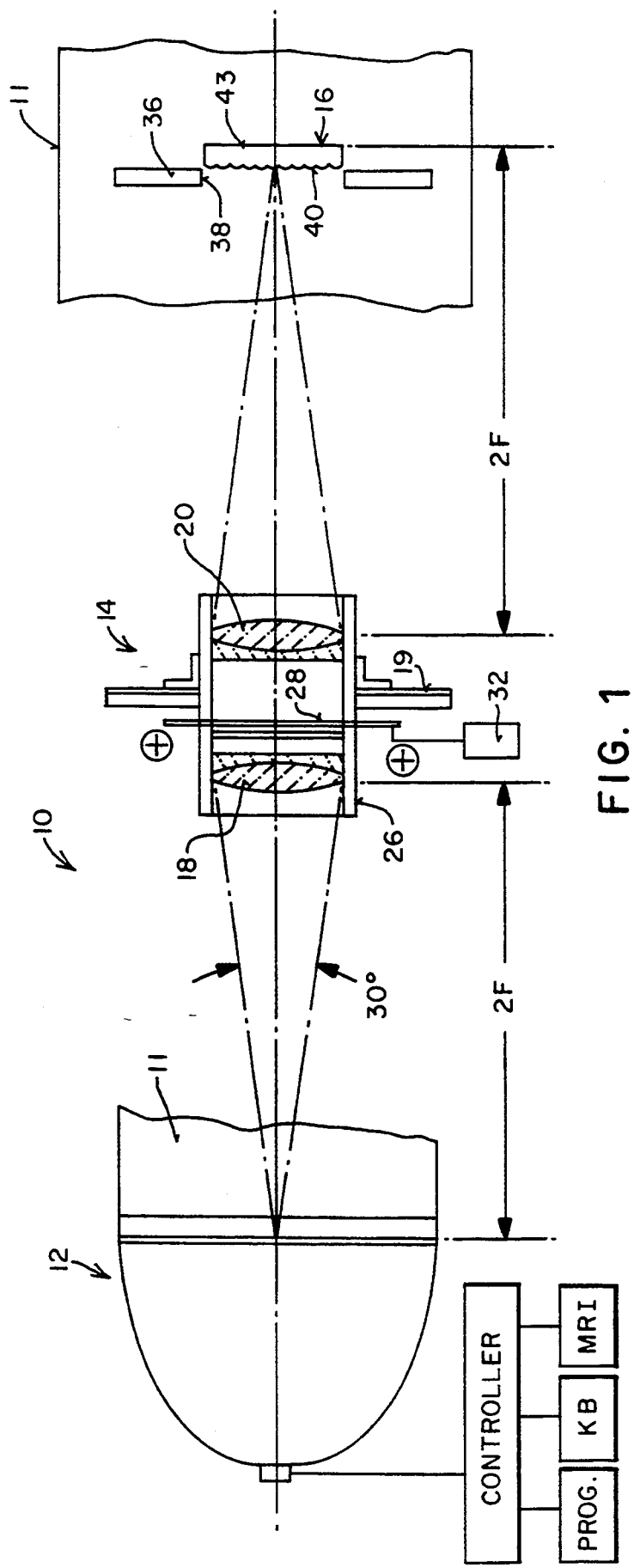
FIG. 1 is a schematic view of a first embodiment of an optical apparatus for carrying out the method of the present invention, showing a curtain shutter adjacent to a lens assembly for triggering the apparatus.

The optical system for carrying out the first embodiment of the method of the present invention is broadly denoted by the numeral 10 and includes a housing 11 containing a monitor, such as a television monitor 12, which has a flat panel viewing screen which can be an LCD or CRT flat panel display. For purposes illustration, monitor 12 is a Zenith ZCM-1490 CRT unit made by Zenith Data Systems of Chicago, Ill.

The monitor 12 provides an image source for the rest of the optical schematic 10, including a lens system 14 between monitor 12 and a lenticular film 16. The lens systems includes a first achromatic lens 18 in a lens support 19, lens 18 being spaced a distance 2F from the flat panel display of monitor 12 (F is the focal length of lens system 14). A second achromatic lens 20 is carried by lens support 19 and is spaced a distance 2F from the lenticular film 16.

Figure 2:
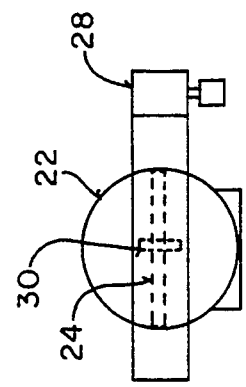
FIG. 2 is a perspective view of the curtain shutter.
Figure 1A:
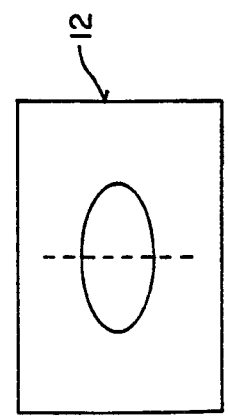
FIG. 1A is a front elevational view of the viewing screen of a CRT or LCD unit.

Lens system 14 further includes curtain shutter 28 (FIG. 2) adjacent to a disk member 22 having a horizontal slot 24 therein and mounted within the lens support 19 of lens assembly 14 between the two achromatic lenses 18 and 20. Curtain shutter 28 has a vertical slit 30 therein. The vertical slit 30 of member 28 travels across horizontal slot 24 during the exposure period. Means 32 coupled with member 28 causes the curtain of member 28 to move relative to the horizontal slot 24 of member 22. During the exposure period, light rays from an image on the viewing screen pass through the lenses 18 and 20 and strike the lenticular surface of film 16. The image on the viewing screen will shift as described above.

A frame or member holder 36 outlines an opening 38 for receiving light rays from lens assembly 14 which strikes the lenticular member 40 and then is focused on the lenticular film 16, the emulsion 43 of the film facing away from the lens 18.

The steps in carrying out the first embodiment of the method of the present invention are as follows:
1. Load the lenticular film 16 in the optical system of FIG. 1 with the film emulsion side against the holder 36;
2. Place the film holder 36 in the metering back position;
3. While the shutter 28 is closed, set the speed of the curtain shutter 28 (match the speed of the video rotation or translation sequence);
4. Pull out the dark slide of the film holder 36;
5. Trigger the start curtain shutter 28 in video rotation or translation sequence;
6. Close the shutter 28;
7. Remove the film holder 36 from the housing; and
8. Follow the Polaroid processing instructions.

The apparatus for carrying out the method which is the second embodiment of the present invention is denoted by the numeral 70 and includes a housing 72 having a wall 74 midway between the ends thereof for mounting an electronic shutter 76 adjacent to an achromatic lens 78. At the upstream end of the housing, the open end 80 in the housing 72 is adjacent to the viewing screen 82 of a television monitor, such as an LCD or CRT monitor. For purposes of illustration, the monitor 89 is comprised of a Zenith Tension-Mask Flat Panel CRT Model ZCM-L490. The flat panel display 82 is approximately 24" from the achromatic lens 78 adjacent to the electric shutter 76.

Lens 78 is also about 24" from a Polaroid 8×10 film holder 90 having a metering back 92, the film holder 90 being supported on a frame 94 which closes one end of the housing 72. Moreover, a lenticular negative film 96 lies flat against a grating 98 and a motor drive 100 drives the grating across the path of light rays emanating from the image on the viewing screen and passing through lens system 78. The lenticular film associated with drive 100 does not move during the exposure period. The grating slides one pitch line during exposure. The is the same pitch as the lenticular film pitch.

Figure 3:
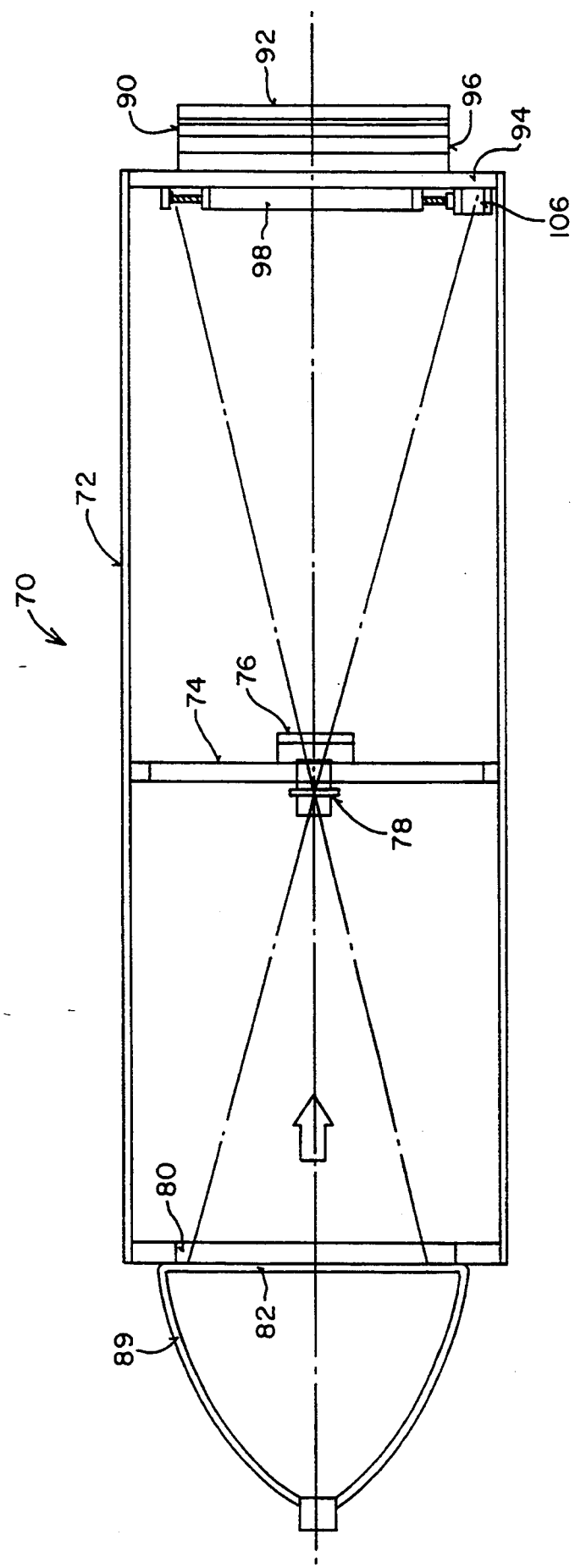
FIG. 3 is a view similar to FIG. 1 but showing another, preferred embodiment of the apparatus of the present invention for carrying out the method of the present invention.
Figure 4:
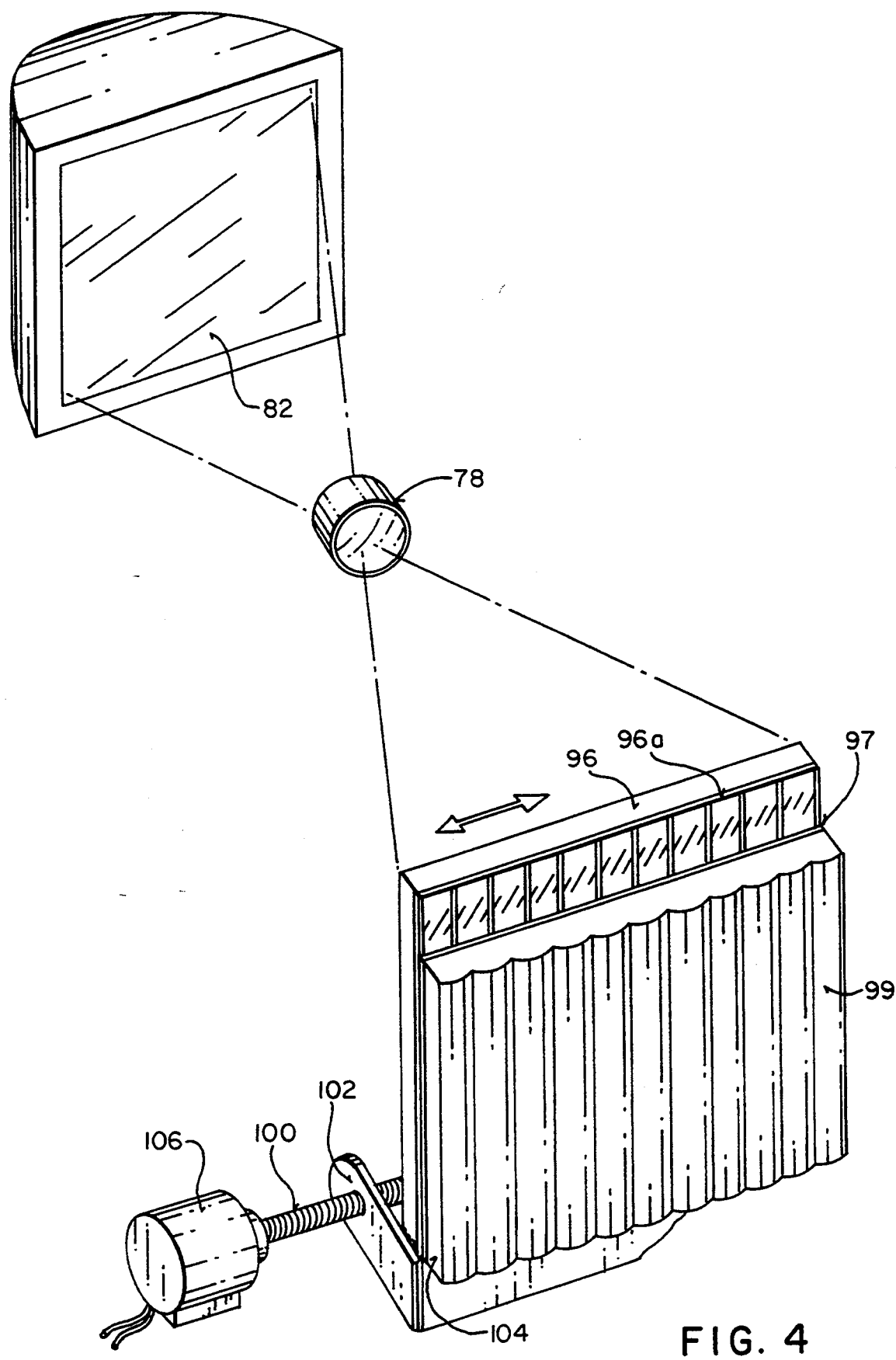
FIG. 4 is a view of the embodiment of FIG. 3, showing a flat panel LCD or CRT display spaced from a grating and a lenticular film.

FIG. 4 is an enlarged partly schematic view of the system of FIG. 3, showing the lens system 78 spaced from monitor 82 which can be an LCD or CRT flat panel display. A grating 96 has grating face 96a in the rear of the grating as shown in FIG. 4 and the rear of grating 96 is adjacent to the film 97 which has a sensitive emulsion. Stationary lenticular screen 99 mounts the film on the front face thereof.

A screw 100 mounted by a bracket 102 on support 104 is coupled to the stepper motor 106, and stepper motor 106 advances the grating in accordance with a predetermined sequence in sequence with the image movement on the screen of the monitor.

The method of operation of the system of FIGS. 3 and 4 includes the following steps:
1. Load the lenticular negative film emulsion side towards a dark slide;
2. Place the film holder in the frame of metering back;
3. Pull out the slide and bring the Ronchi grating into contact with the emulsion of the negative film;
4. Set the video sequence and the Ronchi grating at the starting point;
5. Open the shutter, start the video sequence and Ronchi motion simultaneously;
6. At the end of the video sequence, close the shutter and stop the Ronchi motion simultaneously;
7. Swing the Ronchi grating away from the film;
8. Replace the slide with a dark slide;
9. Remove the Polaroid holder;
10. Place the Polaroid holder, face up, on a processor tray;
11. Follow the processor instructions of Polaroid in Exhibit B.

The method of operation of the system of FIG. 3 includes the following steps:
1. Load the lenticular negative film emulsion side towards a dark slide;
2. Place the film holder in the frame of metering back;
3. Pull out the slide and bring the Ronchi grating into contact with the emulsion of the negative film;
4. Set the video sequence and the Ronchi grating at the starting point;
5. Open the shutter, start the video sequence and Ronchi motion simultaneously;
6. At the end of the video sequence, close the shutter and stop the Ronchi motion simultaneously;
7. Swing the Ronchi grating away from the film;
8. Replace the slide with a dark slide;
9. Remove the Polaroid holder;
10. Place the Polaroid holder, face up, on a processor tray;
11. Follow the processor instructions of Polaroid in Exhibit B.

I claim:
1. An apparatus for forming three-dimensional images of an object represented by data from a magnetic resonance imaging (MRI) unit comprising:
a housing;
means in the housing for providing a display screen for displaying the MRI data as a two-dimensional image of an object, said means being operable to rotate the image about a selective axis or translate the image relative to a reference with the image being representative of the object analyzed by said

MRI unit, the image being in the form of light rays emanating from said screen;

lens means for focusing the light rays on a film plane spaced from said providing means;

a lenticular film at said film plane, said film having a lenticular screen and an emulsion thereon; and means between the lens system means and the lenticular film for causing the light rays to form a continuum of views of the image applied through the lenticular screen to the film emulsion whereby, when the emulsion is developed, the continuum of views can be viewed through the lenticular screen.

2. Apparatus as set forth in claim 1, wherein said causing means includes a curtain shutter.

3. Apparatus as set forth in claim 2, wherein said curtain shutter is adjacent to the lens means.

4. Apparatus as set forth in claim 2, wherein said curtain shutter includes a curtain shutter member having a vertical slit, means moving said curtain across the path of said light rays, and means defining a horizontal slit in intercepting relationship to the vertical slit, whereby the relative movements of the slits will cause the light rays to form a continuum of views on the emulsion of said lenticular film.

5. Apparatus as set forth in claim 2, wherein said lens means includes a pair of spaced achromatic lenses between said providing means and said film plane, said shutter being in the space between the lenses.

6. Apparatus as set forth in claim 1, wherein said causing means includes a grating having spaced pitch lines adjacent to the emulsion of the lenticular film, and means coupled with the grating and the lenticular film for moving the grating and lenticular film relative to each other.

7. Apparatus as set forth in claim 6, wherein said grating is moved relative to the film, said moving means being coupled with the grating for moving the grating relative to the film.

8. Apparatus as set forth in claim 6, wherein said moving means includes a power drive coupled with the lenticular film for moving the film relative to the grating.

9. Apparatus as set forth in claim 6, wherein said grating is a Ronchi grating.

10. Apparatus as set forth in claim 1, wherein is included an MRI unit coupled with the display screen to provide data thereto of an object to be analyzed.

11. Apparatus as set forth in claim 10, wherein is included a computer having a program, a keyboard, and a controller coupled with the MRI unit.

12. A method for forming three-dimensional images of an object represented by data collected by a magnetic resonance imaging (MRI) unit comprising:

providing a display screen for displaying the data as a two-dimensional image of the object;

rotating the image about a selected center line with the image being representative of the object analyzed by said MRI unit, the image being in the form of light rays emanating from said screen;

placing a lenticular film at a film plane, said film plane having an emulsion thereon;

focusing the light rays on a film plane spaced from said providing means; and causing the light rays to form a continuum of views of the image applied to the film emulsion whereby, when the emulsion is developed, the continuum of views can be viewed through a lenticular screen attached to the film.

13. A method as set forth in claim 12, wherein said causing step includes shifting a vertical slit curtain shutter.

14. A method as set forth in claim 13, wherein is included the step of mounting said curtain shutter adjacent to a zone of a lens.

15. A method as set forth in claim 13, wherein said causing step includes moving said vertical slit across the path of said light rays and past a fixed horizontal slit.

16. A method as set forth in claim 12, wherein is included placing a pair of achromatic lenses between said providing means and said film plane and placing a shutter in the space between the lenses.

17. A method as set forth in claim 12, wherein is included placing a grating having spaced pitch lines adjacent to the emulsion of the lenticular film, and moving the grating and lenticular film relative to each other.

18. A method as set forth in claim 17, wherein the moving step includes shifting said grating relative to the film.

19. A method as set forth in claim 17, wherein said moving step includes moving the film relative to the grating.

20. A method as set forth in claim 17, wherein said grating is a Ronchi grating.

* * * * *

UNITED STATES PATENT AND TRADEMARK OFFICE
CERTIFICATE OF CORRECTION

PATENT NO. : 5,337,102
DATED : August 9, 1994
INVENTOR(S) : Winnek, et al.

It is certified that error appears in the above-indentified patent and that said Letters Patent is hereby corrected as shown below:

On the title page item [76], "Douglas A. Winnek" with --Douglas F. Winnek--.

Column 2, line 3, delete 10° to 3020" and replace with --10° to 30°--.

Column 2, line 4, delete "is typically 24 inches" and replace with --12 inches focal length--.

Column 4, line 2, after "exposure. The" add --grating--.

Column 4, line 36, after "Polaroid" delete through column 4, line 58.

Signed and Sealed this

Twenty-ninth Day of November, 1994

Attest:

BRUCE LEHMAN

Attesting Officer

*Commissioner of Patents and Trademarks*